United States Patent
Yoo et al.

(10) Patent No.: US 6,815,072 B2
(45) Date of Patent: Nov. 9, 2004

(54) METHOD TO SOLVE PARTICLE PERFORMANCE OF FSG LAYER BY USING UFU SEASON FILM FOR FSG PROCESS

(75) Inventors: Ming-Hwa Yoo, Hsiu-Chu (TW); Yi-Lung Cheng, Taipei (TW); Szu-An Wu, Hsin-Chu (TW); Ying-Lang Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/256,714

(22) Filed: Sep. 27, 2002

(65) Prior Publication Data

US 2003/0068444 A1 Apr. 10, 2003

Related U.S. Application Data

(62) Division of application No. 09/747,135, filed on Dec. 26, 2000, now Pat. No. 6,479,098.

(51) Int. Cl.$^7$ ............................ B05C 11/00; B32B 17/06
(52) U.S. Cl. ....................... 428/428; 428/213; 428/426; 428/336; 118/723 R; 118/728; 118/733
(58) Field of Search .................................. 428/426, 428, 428/213, 336; 118/715, 719, 728, 733, 723 R

(56) References Cited

U.S. PATENT DOCUMENTS

| | | | | |
|---|---|---|---|---|
| 5,811,356 A | | 9/1998 | Murugesh et al. | 438/711 |
| 5,937,323 A | * | 8/1999 | Orczyk et al. | 438/624 |
| 5,976,900 A | | 11/1999 | Qiao et al. | 438/14 |
| 6,014,979 A | | 1/2000 | Van Autryve et al. | 134/1.1 |
| 6,020,035 A | | 2/2000 | Gupta et al. | 427/534 |
| 6,060,397 A | | 5/2000 | Seamons et al. | 438/694 |
| 6,103,601 A | * | 8/2000 | Lee et al. | 438/513 |
| 6,271,146 B1 | * | 8/2001 | Ross | 438/723 |
| 6,374,770 B1 | * | 4/2002 | Lee et al. | 118/723 E |

* cited by examiner

*Primary Examiner*—Stephen Stein

(57) ABSTRACT

A method for reducing contaminants in a processing chamber 10 having chamber plasma processing region components comprising the following steps. The chamber plasma processing region components are cleaned. The chamber is then seasoned as follows. A first USG layer is formed over the chamber plasma processing region components. An FSG layer is formed over the first USG layer. A second USG layer is formed over the FSG layer. Wherein the USG, FSG, and second USG layers comprise a UFU season film. A UFU season film coating the chamber plasma processing region components of a processing chamber comprises: an inner USG layer over the chamber plasma processing region components; an FSG layer over the inner USG layer; and an outer USG layer over the FSG layer.

10 Claims, 4 Drawing Sheets

Comparison of UF and UFU season film by KLA scan

| Split Condition | #11 UF | #12 UF | #13 UF | #14 UF | #15 UF | #16 UF | Aver | #11 UFU | #12 UFU | #13 UFU | #14 UFU | #15 UFU | #16 UFU | Aver |
|---|---|---|---|---|---|---|---|---|---|---|---|---|---|---|
| KLA Scan Particle | 14 | 11 | 8 | 7 | 9 | 15 | 10.7 | 8 | 12 | 11 | 7 | 14 | 6 | 9.667 |
| FSC(Size<0.3um) | 4 | 8 | 3 | 1 | 1 | 1 | 3 | 1 | 1 | 0 | 0 | 0 | 0 | 0.333 |
| (0.3um - 0.5um) | 0 | 1 | 0 | 1 | 1 | 3 | 2 | 0 | 0 | 0 | 0 | 0 | 0 | 0.2 |
| (0.5um - 1um) | 0 | 0 | 0 | 0 | 0 | 0 | 0 | 0 | 0 | 0 | 0 | 0 | 0 | 0 |
| (1um - 2um) | 0 | 0 | 0 | 0 | 0 | 0 | 0.2 | 0 | 1 | 0 | 0 | 1 | 1 | 0.2 |
| (Size > 2um) | 0 | 0 | 1 | 1 | 0 | 0 | 0.2 | 0 | 1 | 0 | 0 | 2 | 0 | 0.5 |

FIG. 4

METHOD TO SOLVE PARTICLE PERFORMANCE OF FSG LAYER BY USING UFU SEASON FILM FOR FSG PROCESS

This is a division of patent application Ser. No. 09/747,135, now U. S. Pat. No. 6,479,098, filed date Dec. 26, 2000, Method To Solve Particle Performance Of FSG Layer By Using UFU Season Film for FSG Process, assigned to the same assignee as the present invention.

FIELD OF THE INVENTION

The present invention relates generally to fabrication of integrated circuit devices and specifically to methods of cleaning/seasoning reaction chambers used in the processes to fabricate integrated circuit devices.

BACKGROUND OF THE INVENTION

In high temperature plasma processes, such as high-density plasma (HDP), and chemical vapor deposition (CVD) processes, the likelihood that undesirable mobile ion and metal contaminants will be driven out of the reaction chamber components increases. Therefore the chamber components and the exposed surface of the wafer chucks are seasoned, or coated, to minimize these undesirable mobile ion and metal contaminants and to also protect these parts/surfaces during the necessary cleaning processes.

HDP-CVD Processing Chamber

FIG. 1 illustrates a cross-sectional view of a typical HDP-CVD processing chamber 10. Processing chamber 10 includes chamber body 12 supporting dielectric dome 14 on its upper edge: Chamber body 12 functions as an anode and may be composed of aluminum, for example. Inductive coil 16 insulated within insulative coil holder 18, is positioned around dielectric dome 12 to provide an inductive plasma source. Conducting, or semi-conducting; chamber lid 20 is supported on the upper surface of dielectric dome 14 and functions as another anode. An electrostatic chuck 22 is positioned in the lower part of chamber 10 and supports substrate 24 during processing. Insulative dielectric material ring 26 surrounds the outer perimeter of chuck 22 to prevent arcing between chuck 22 and the grounded chamber walls. Insulative ring 26 may be comprised of a ceramic, for example.

Gases enter chamber 10 through gas inlets (not shown) positioned around the perimeter of chamber body 12 and in chamber lid 20 above chuck 22. Chamber 10 is exhausted through exhaust passage 28 outward of the outer edge of chuck 22 by an exhaust pump (not shown). A throttle and gate valve assembly control pressure within chamber 10 by controlling the exhaust of gases out of chamber 10.

An RF voltage is provided through inductive coil 16 (source RF) to generate a high density plasma (HDP). The RF voltage applied to coil 16 excite the gas introduced into chamber 10 into a plasma state. Additionally, an RF voltage may be coupled to chamber lid 20 to provide a bias RF signal into chamber 10.

Depending upon the application, precursor gases may be introduced into chamber 10 to deposit a material onto substrate 24, or etch material from substrate 24, to form integrated circuits (IC) on substrate 24.

Contaminant Material

Chamber lid 20, ceramic ring 26, dielectric dome 14, enclosure wall 12 and gas inlets form part of the plasma processing region and are sources of contaminant material which may be volatilized into the gas phase under operating conditions within chamber 10, thereby contaminating the processing environment. For example mobile ions such as Na, Li and K, and metal particles such as Fe, Cr, Ar, Ni and Mg may be leached out of chamber components 20, 26, 14, 12 when a capacitive or an inductive plasma is struck in chamber 10. Such mobile ions and/or metal particles, when incorporated into the deposited films, compromise the structural integrity and electrical performance of the devices formed on substrate 24. Also, deposits on chamber components 20, 26, 14, 12 can buildup after a series of substrates 24 have been processed that can flake off and become another source of particles that can damage the circuits.

Chamber Cleaning/Seasoning

Such particle contamination within chamber 10 is controlled by periodically cleaning chamber 10 using cleaning gases, usually fluorinated compounds and inductively and capacitively coupled plasmas. Once the chamber has been sufficiently cleaned of the process gases and the cleaning by-products have been exhausted out of chamber 10, a season step is performed to deposit a layer of material onto components 20, 26, 14, 12 of chamber 10 forming the processing region to seal the contaminants and reduce the contamination level during processing. The cleaning step is typically carried out by depositing a film to coat the interior surfaces forming the processing region.

Silane gas may be used to deposit a layer of silicon dioxide onto components 20, 26, 14, 12:

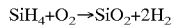

Silicon tetrafluoride may likewise be used to deposit a layer of silicon oxyfluoride:

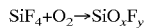

Other season films may also be used.

For example, U.S. Pat. No. 5,811,356 to Murugesh et al and U.S. Pat. No. 6,020,035 to Gupta et al. describe seasoning processes involving fluorinated silica glass (FSG) layers.

U.S. Pat. No. 6,060,397 to Seamons et al. and U.S. Pat. No. 6,014,979 to Van Autryve et al. describe seasoning processes.

U.S. Pat. No. 5,976,900 to Qiao et al. describes a method whereby a phosphorous and/or a boron coating film is used after cleaning.

SUMMARY OF THE INVENTION

Accordingly, it is an object of the present invention to utilize a sandwich USG/FSG/USG (UFU) chamber season film regimen for high temperature chamber processing.

Another object of the present invention is to improve the particle performance of the FSG season film.

A further object of the present invention is to increase the available time of HDP FSG CVD machine (M/C) result from particle down.

Yet another object of the present invention is to maintain a minimal statistical deviation of fluorine concentration ([F]) within the FSG layer of a UFU chamber season film.

Other Objects will Appear Hereinafter

It has now been discovered that the above and other objects of the present invention may be accomplished in the following manner. Specifically, the chamber plasma processing region components of a processing chamber are cleaned. The chamber is then seasoned as follows. A first USG layer is formed over the chamber plasma processing region components. An FSG layer is formed over the first USG layer. A second USG layer is formed over the FSG layer. Wherein the USG, FSG, and second USG layers comprise a UFU season film. A UFU season film coating the chamber plasma processing region components of a processing chamber comprises: an inner USG layer over the chamber plasma processing region components; an FSG layer over the inner USG layer; and an outer USG layer over the FSG layer.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIG. 4 is a table comparison of the particle count for the STD Clean Process (UF) known to the inventors and the present invention UFU Season Film for 2× Clean (UFU).

DETAILED DESCRIPTION OF THE PREFERRED EMBODIMENT

Unless otherwise specified, all structures, layers, steps, methods, etc. may be formed or accomplished by conventional steps or methods known in the prior art.

Figure 2:
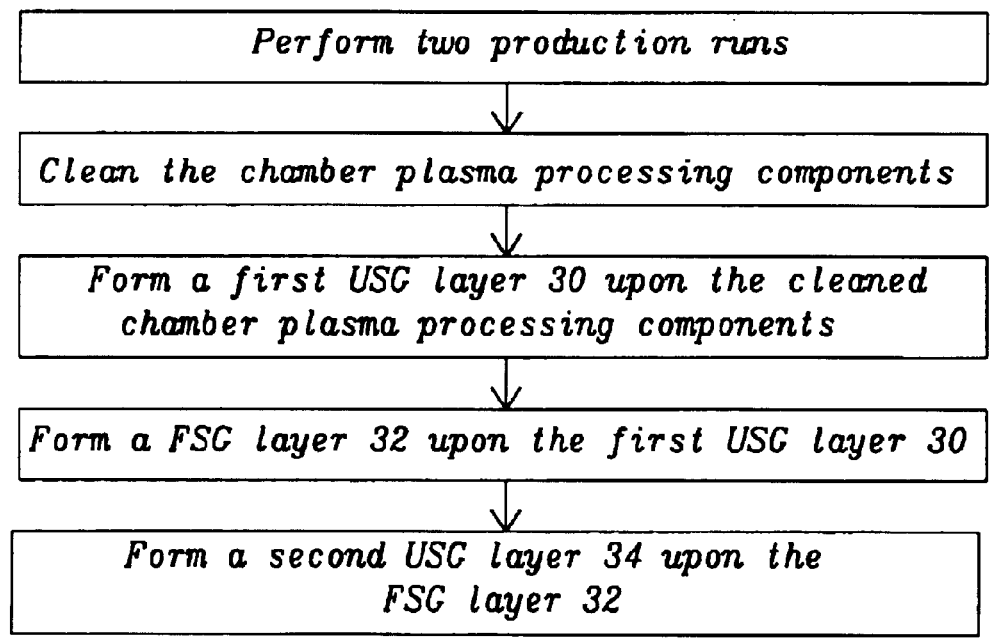
FIG. 2 is a flow diagram illustrating the method of the present invention.

Accordingly, FIG. 2 is a flow chart of the method of the present invention. That is: (1) two production runs are conducted within chamber 10 (i.e. two sets of wafers are processed within chamber 10); (2) the chamber plasma processing region components (20, 26, 14, 12 and the gas inlets (not shown)) are then cleaned; (3) a first undoped silica glass (USG) layer 30 is formed upon the cleaned chamber plasma processing region components; (4) a thin doped fluorine silica glass (FSG) layer 32 is formed upon the first USG layer; (5) a second USG layer 34 is then formed upon the FSG layer 32 to complete formation of UFU season film 50.

Figure 1:
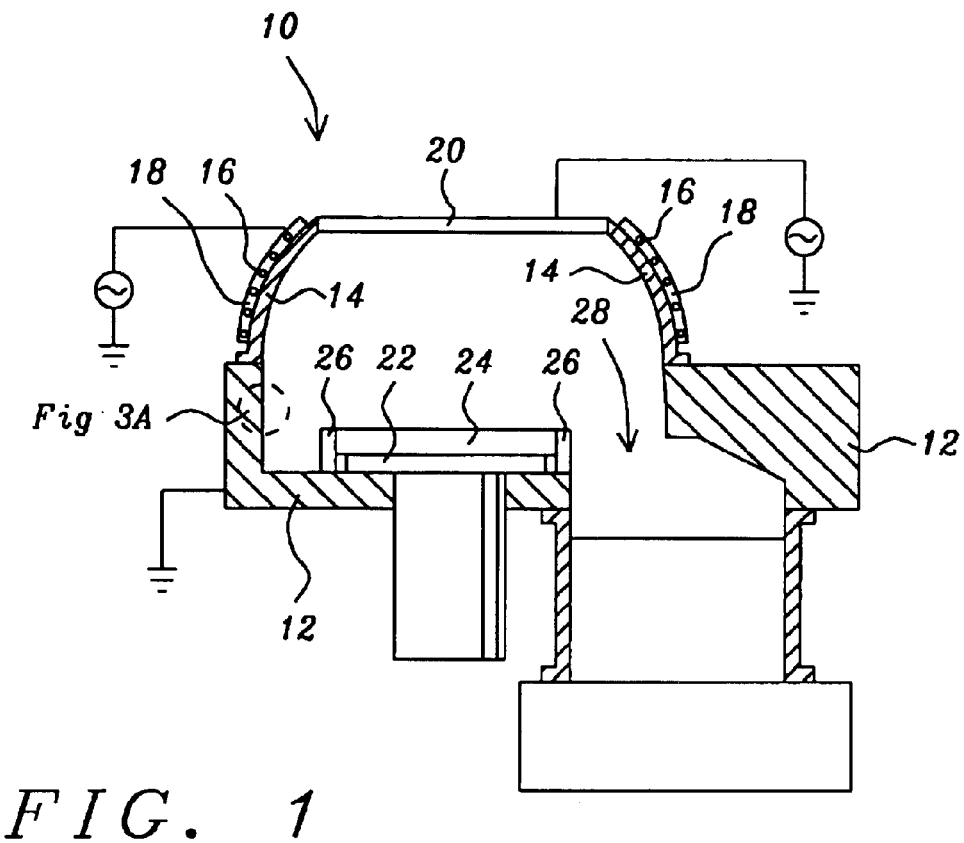
FIG. 1 is a schematic view of an HDP-CVD process chamber.
Figure 3A:
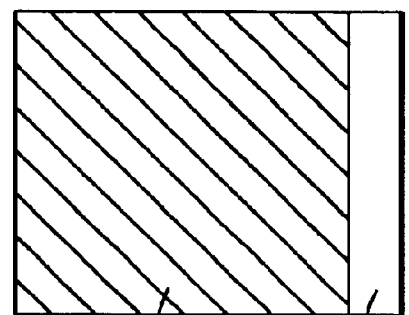
FIG. 3A is an enlarged view of the process chamber wall portion of FIG. 1 designated "FIG. 3A" illustrating the formation of the UFU seasoning film in accordance with the present invention.
Figure 3B:
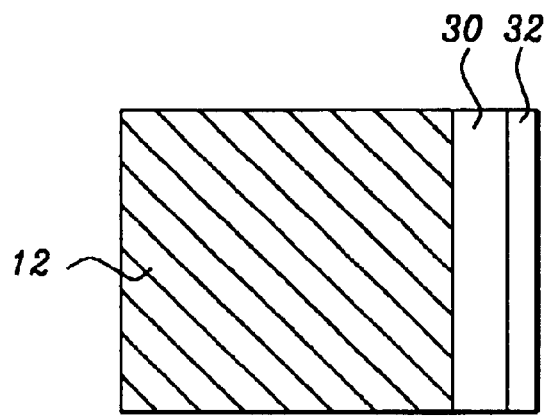
FIGS. 3B and 3C, with FIG. 3A, illustrate the preferred embodiment of the present invention.
Figure 3C:
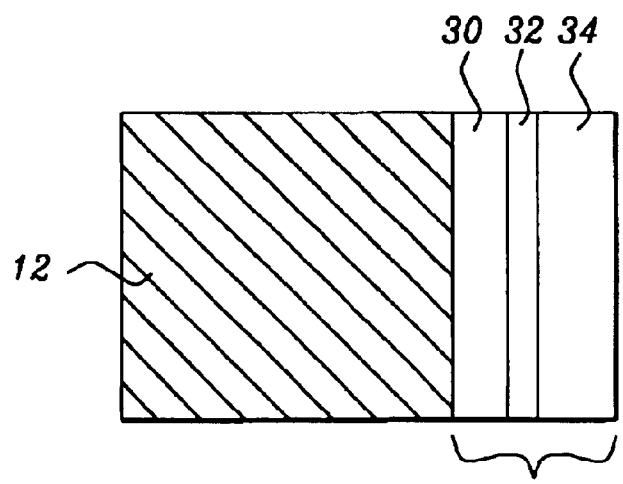

FIGS. 3A to 3C illustrate cross-sectional schematic views of the preferred method in forming season film 50 in accordance with the present invention. It is noted that although only a portion of chamber body 12 wall is specifically illustrated in FIGS. 3A to 3C, season film 50 is formed on all of chamber plasma processing region components 20, 26, 14, 12 and the gas inlets (not shown). FIG. 3A is an enlarged view of the portion of FIG. 1 denoted as "FIG. 3A."

The method of the present invention allows for two production runs within chamber 10 before cleaning/seasoning steps are required. After two production runs, the chamber plasma processing region components (20, 26, 14, 12 and the gas inlets (not shown)) are cleaned by an appropriate process/method. The preferred chamber cleaning method used if UFU season film for two production runs. Formation of UFU Season Film 50

As shown in FIG. 3A, a first undoped silica glass (USG) layer 30, preferably having a thickness of from about 900 to 1100 Å, more preferably from about 950 to 1050 Å, and most preferably about 1000 Å, is formed upon the cleaned chamber plasma processing region components (20, 26, 14, 12 and the gas inlets (not shown)) under the following conditions:

Season - 1

| | |
|---|---|
| about 20 seconds by time | Ar-side about 95 sccm |
| turbo about 50 mT | Ar-top about 15 sccm |
| about 3500 W RF, about 1W side-RF | $O_2$-side about 270 sccm |
| 0W OFF | $O_2$-top about 20 sccm |
| | $SiH_4$-side about 180 sccm |
| | $SiF_4$ 0 sccm |

Thin doped fluorine oxide (fluorine silica glass (FSG)) season layer 32, preferably having a thickness from about 270 to 330 Å, more preferably from about 285 to 315 Å, and most preferably about 300 Å, is them formed upon first USG layer 30 under the following conditions:

F Intro

| | |
|---|---|
| about 3 seconds by time | Ar-side about 95 sccm |
| turbo about 50 mT | Ar-top about 15 sccm |
| about 3500 W RF, about 1W side-RF | $O_2$-side about 270 sccm |
| 0W OFF | $O_2$-top about 20 sccm |
| | $SiH_4$-side about 180 sccm |
| | $SiF_4$ about 5 sccm |

F Purge

| | |
|---|---|
| about 3 seconds by time | Ar-side about 95 sccm |
| turbo about 50 mT | Ar-top about 15 sccm |
| about 3500 W RF, about 1W side-RF | $O_2$-side about 270 sccm |
| 0W OFF | $O_2$-top about 20 sccm |
| | $SiH_4$-side about 180 sccm |
| | $SiF_4$ about 5 sccm |

FSG layer 32 has a fluorine concentration ([F]) less than about 4% but greater than the [F] of the wafer.

FSG layer 32 avoids fluorine deviation for fluorine concentration from wafer to wafer because [F] is controlled by diffusion mechanism instead of surface concentration limit. Furthermore, because the layer 34 is fluorine free, the diffusion and not the surface concentration controls.

Second USG layer 34, having a thickness of preferably from about 1350 to 1650 Å, more preferably from about 1450 to 1550 Å, and most preferably about 1500 Å, is then formed upon FSG film 32 under the following conditions:

Season - 2

| | |
|---|---|
| about 32 seconds by time | Ar-side about 95 sccm |
| turbo about 50 mT | Ar-top about 15 sccm |
| about 3500 W RF, about 1W side-RF | $O_2$-side about 270 sccm |
| 0W OFF | $O_2$-top about 20 sccm |
| | $SiH_4$-side about 180 sccm |
| | $SiF_4$ 0 sccm |

Second USG layer 34 seals the weakened surface of FSG layer 32, avoiding particle source.

First USG layer 30/FSG layer 32/second USG layer 34 sandwich structure comprise UFU season film 50.
Standard Clean Process—A Process Known to the Inventors The standard clean process (STD Clean Process) (not shown) known to the inventors (not to be considered prior art) is a 1× clean process, i.e. the plasma processing region components are cleaned/seasoned after only a single production run. Under the STD Clean Process a single USG layer is formed upon the cleaned chamber plasma processing region components under the following conditions:

| Season | |
|---|---|
| about 45 seconds by time | Ar-side about 95 sccm |
| turbo about 50 mT | Ar-top about 15 sccm |
| about 3500 W RF, about 1W side-RF | $O_2$-side about 270 sccm |
| 0W OFF | $O_2$-top about 20 sccm |
| | $SiH_4$-side about 180 sccm |
| | $SiF_4$ 0 sccm |

An FSG layer is then formed upon the single USG layer under the following conditions:

| F Intro | |
|---|---|
| about 3 seconds by time | Ar-side about 95 sccm |
| turbo about 50 mT | Ar-top about 15 sccm |
| about 3500 W RF, about 1W side RF | $O_2$-side about 270 sccm |
| 0W OFF | $O_2$-top about 20 sccm |
| | $SiH_4$-side about 180 sccm |
| | $SiF_4$ about 5 sccm |
| F Purge | |
| about 3 seconds by time | Ar-side about 95 sccm |
| turbo about 50 mT | Ar-top about 15 sccm |
| about 3500 W RF, about 1W side-RF | $O_2$-side about 270 sccm |
| 0W OFF | $O_2$-top about 20 sccm |
| | $SiH_4$-side about 180 sccm |
| | $SiF_4$ about 5 sccm |

However, the STD Clean Process still has an unacceptable particle count (see below)

Particle Performance: Present Invention UFU 2× Season Versus STD Clean Process

Wafer cassettes having wafers designated "Bare-0.2," "FSG 8-6.5K," and "FSG 8-6.5K" were sequentially loaded processed. One cassette of wafers designated as "FSG 8-6.5K" were processed under STD Clean Process and one cassette of wafers designated as "FSG 8-6.5K" were processed under the present invention UFU Season Film for 2× Clean with the wafers designated as "Bare-0.2" not so processed:

| | STD Clean Process Particle Count (EA) Total Count/Area Count | UFU Season Film for 2X Clean Total Count/Area Count |
|---|---|---|
| Bare-0.2 | 104/3 | 0/1 |
| FSG 8-6.5K | 15/0 | 0/0 |
| FSG 8-6.5K | 4/1 | 1/0 |

Comparison of Particle Counts for STD Clean Process and UFU Season Film for 2× Clean FIG. 4 is a chart comparison of the particle count for the STD Clean Process ("UF") known to the inventors and the present invention UFU Season Film for 2× Clean ("UFU") by KLA scan (in-line data). (KLA is a kind of instrument for particle detection production wafer.)

As evidenced by the FIG. 4 chart, the particle count (EA) when utilizing the UFU method of the present invention is markedly decreased for particle sizes equal to or smaller than about 0.5 $\mu$m. That is: for particle size<0.3 $\mu$m, the average EA for the UF split condition is 3 while the average EA for the UFU split condition is but 0.333; and for particle size from about 0.3 to 0.5 $\mu$m, the average EA for the UF split condition is 2 while the average EA for the UFU split condition is but 0.2. The particle count (EA) is not improved for particle sizes larger than about 0.5 $\mu$m when utilizing the UFU method of the present invention.

Figure 5:
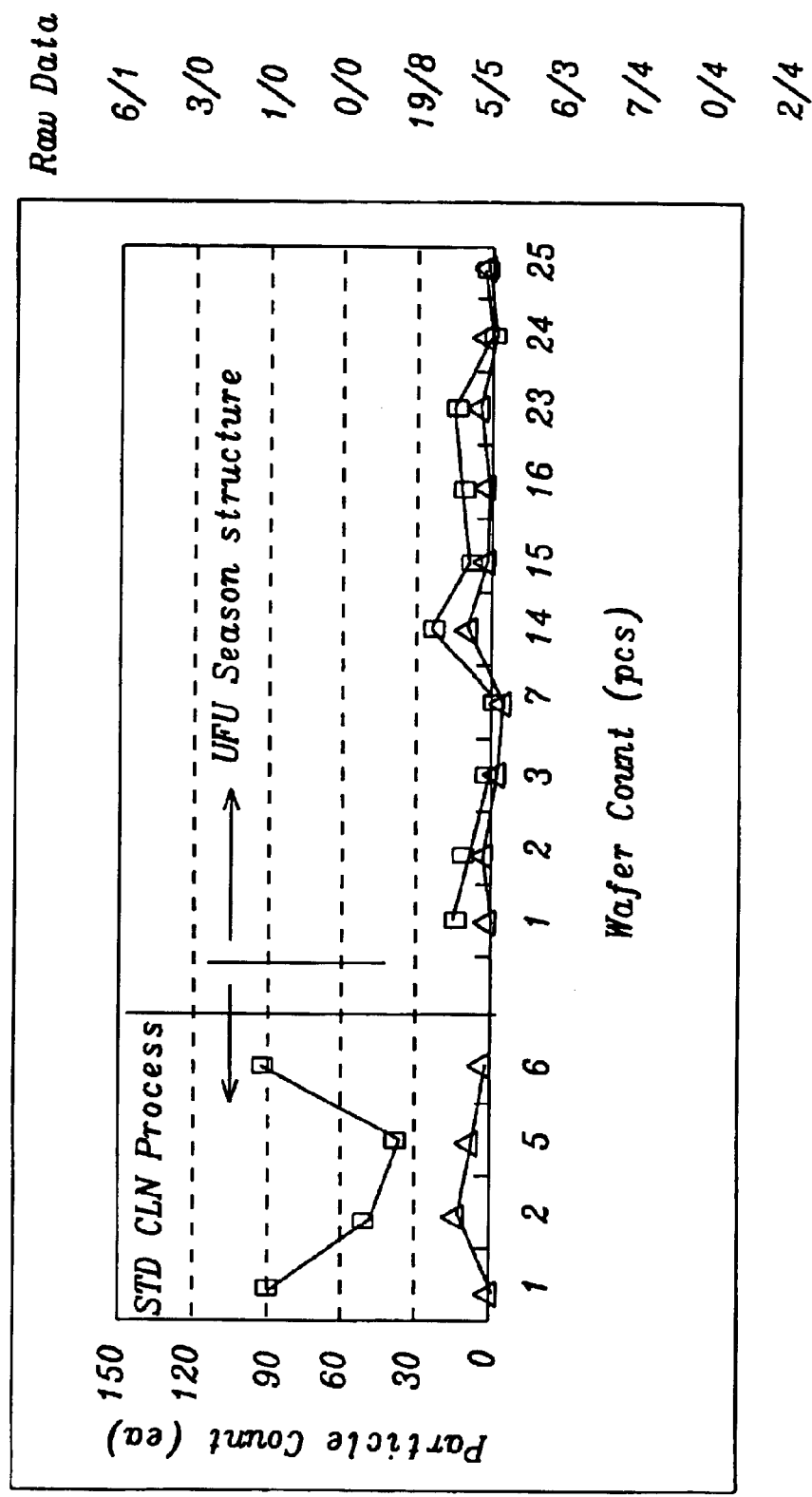
FIG. 5 is a graph comparison of the particle count for the STD Clean Process known to the inventors and the present invention UFU Season Film for 2× Clean.

FIG. 5 is a graph comparison (special precise control (SPC) off-line data) of the particle count for the STD Clean Process (STD CLN Process) known to the inventors and the present invention UFU Season Film for 2× Clean (UFU Season Structure). The SPC defines any control limits for production parameters, including particle.

Particle count (EA) is plotted versus wafer count (pieces) with the raw data for two runs when the present invention is utilized is shown to the right of the graph. As is evident, the particle count when then the instant UFU invention is greatly, and consistently reduced, compared to the STD Clean Process as shown on the left side of the graph for pieces 1, 2, 5, and 6, and when two runs utilizing the present are graphed to the right of the STD Clean Process comparison for pieces 1, 2, 3, 7, 14, 15, 16, 23, 24, and 25.

A further study of particle trend and total particle count by using the UFU season film 50 in accordance with the present invention as compared to a UF season film presented the following results for three cases:

| | Average of UF | Average of UFU |
|---|---|---|
| 1. | 12.2 | 10.5 |
| 2. | 17.9 | 10.5 |
| 3. | 18.8 | 9.7 |

[F] Concentration Variation

It has been found that the variation of fluorine concentration ([F]) when using the UFU Season Film method of the present invention is acceptable as compared to no introduction of F in the season film, with F introduction in the exposed season film, and using the UFU Season Film method (USG/FSG/USG) shown below:

| | No Fluorine introduction | With Fluorine introduction | UFU Season Film |
|---|---|---|---|
| 1st w/f | 3.99 | 4.17 | 4.42 |
| 2nd w/f | 4.23 | 4.19 | 4.46 |
| Δ | +0.24 | +0.02 | +0.04 |

The F deviation of +0.24 when no F is introduced is too great, while the F deviation when using the UFU season film 50 of the present invention is acceptable as the F concentration is controlled by diffusion mechanism instead of surface concentration limit. The F concentration refers to the layer with fluorine introduction, which is the UF layer.

Advantages of the Present Invention

The advantages of the present invention include:

1. for particle count performance, the particle count (EA) could decrease 10 EA from 10 EA to 10EA for mean value of off-line SPC and in-line KLA data;
2. deviation of [F] is largely decreased by using UFU season film 50; and
3. the FSG machine (M/C) capacity is increased.

While particular embodiments of the present invention have been illustrated and described, it is not intended to limit the invention, except as defined by the following claims.

We claim:

1. A UFU season film coating the chamber plasma processing region components of a processing chamber, comprising:
   - an inner USG layer over the chamber plasma processing region components;
   - an FSG layer over the inner USG layer; and
   - an outer USG layer over the FSG layer.

2. The article of claim 1, wherein the inner USG layer is from about 900 to 1100 Å thick, the FSG layer is from about 270 to 330 Å thick, and the outer USG layer is from about 1350 to 1650 Å thick.

3. The article of claim 1, wherein the inner USG layer is from about 950 to 1050 Å thick, the FSG layer is from about 285 to 315 Å thick, and the outer USG layer is from about 1450 to 1550 Å thick.

4. The article of claim 1, wherein the inner USG layer is about 1000 Å thick, the FSG layer is about 300 Å thick, and the outer USG layer is about 1500 Å thick.

5. The article of claim 1, wherein the FSG layer has less than about 4% fluorine.

6. A UFU season film coating the chamber plasma processing region components of a processing chamber, comprising:
   - an inner USG layer over the chamber plasma processing region components; the lower USG layer having a thickness of from about 900 to 1100 Å;
   - an FSG layer over the inner USG layer 30; the FSG layer having a thickness of from about 270 to 330 Å and less than about 4% F; and
   - an outer USG layer over the FSG layer; the outer USG layer having a thickness of from about 1350 to 1650 Å.

7. The article of claim 6, wherein the inner USG layer is from about 950 to 1050 Å thick, the FSG layer is from about 285 to 315 Å thick, and the outer USG layer is from about 1450 to 1550 Å thick.

8. The article of claim 6, wherein the inner USG layer is about 1000 Å thick, the FSG layer is about 300 Å thick, and the outer USG layer is about 1500 Å thick.

9. The article of claim 1, wherein the chamber plasma processing region components are clean.

10. The article of claim 6, wherein the chamber plasma processing region components are clean.

* * * * *

UNITED STATES PATENT AND TRADEMARK OFFICE
CERTIFICATE OF CORRECTION

PATENT NO. : 6,815,072 B2
DATED : November 9, 2004
INVENTOR(S) : Yoo et al.

It is certified that error appears in the above-identified patent and that said Letters Patent is hereby corrected as shown below:

<u>Title page,</u>
Item [75], Inventors, for the first inventor "Ming-Hwa Yoo", please correct the City "Hsiu-Chu" to -- I-Lan --.

Signed and Sealed this

Ninth Day of August, 2005

JON W. DUDAS
*Director of the United States Patent and Trademark Office*